United States Patent
Kai et al.

(10) Patent No.: US 6,663,325 B1
(45) Date of Patent: Dec. 16, 2003

(54) TRANSPORT SYSTEM FOR SPHERICAL OBJECTS AND METHOD OF USING THE TRANSPORT SYSTEM

(75) Inventors: Shuho Kai, Kitakyushu (JP); Takashi Kanatake, Dallas, TX (US); Tashirou Arai, Koimae (JP); Kiyoshi Horii, 5-8-15-501 Kamimeguro, Magura-ku, Tokyo (JP)

(73) Assignees: Mitsui High-Tec, Inc., Kitakyushu (JP); Nippon Pneumatics/Bluidics System Co., Ltd., Kawasaki (JP); Ball Semiconductor Inc., Dallas, TX (US); Kiyoshi Horii, Tokyo (JP)

( * ) Notice: Subject to any disclaimer, the term of this patent is extended or adjusted under 35 U.S.C. 154(b) by 0 days.

(21) Appl. No.: 09/585,251

(22) Filed: May 31, 2000

(30) Foreign Application Priority Data

Jun. 1, 1999 (JP) ........................ H 11-154328

(51) Int. Cl.$^7$ ............................................. B65G 53/00
(52) U.S. Cl. ............................. 406/46; 406/84; 406/94; 406/194; 406/195; 406/198; 406/151; 406/197
(58) Field of Search ............................. 406/46, 47, 48, 406/84, 92, 94, 173, 194, 195, 198, 151, 197

(56) References Cited

U.S. PATENT DOCUMENTS

| | | | | |
|---|---|---|---|---|
| 2,901,421 A | * | 8/1959 | Bourguet et al. | 208/174 |
| 3,212,820 A | * | 10/1965 | Benesh et al. | 302/2 |
| 4,178,662 A | * | 12/1979 | Borodin | 406/21 |
| 4,265,573 A | * | 5/1981 | Reba | 406/152 |
| 4,372,712 A | * | 2/1983 | Powell et al. | 406/153 |
| 4,600,603 A | * | 7/1986 | Mulder | 427/180 |
| 5,252,007 A | * | 10/1993 | Klinzing et al. | 406/14 |
| 5,252,008 A | * | 10/1993 | May et al. | 406/23 |
| 5,846,275 A | * | 12/1998 | Lane et al. | 55/431 |
| 5,955,037 A | * | 9/1999 | Holst et al. | 422/171 |
| 6,053,667 A | * | 4/2000 | Sakai et al. | 406/56 |
| 6,102,629 A | * | 8/2000 | Ishida et al. | 406/52 |
| 6,183,169 B1 | * | 2/2001 | Zhu et al. | 406/123 |
| 6,203,249 B1 | * | 3/2001 | Ishida et al. | 406/85 |
| 6,250,852 B1 | * | 6/2001 | Kai | 406/137 |

* cited by examiner

*Primary Examiner*—Joseph A. Dillon, Jr.
(74) *Attorney, Agent, or Firm*—Wood, Phillips, Katz, Clark & Mortimer

(57) ABSTRACT

A transport system for a spherical object. The transport system has a supply of a first fluid and a passageway for communication of a spherical object in a path between an inlet and an outlet. At least part of the passageway is bounded by a first tube having a first annular wall with at least one opening through the first annular wall. The first tube guides flow of a spherical object in the first fluid from the inlet towards the outlet. The transport system further includes a source of vacuum in communication with the passageway through the at least one opening through the first annular wall. The source of vacuum produces a low pressure region which causes the first fluid in the passageway to be drawn from the passageway through the at least one opening through the first annular wall. The transport system further includes a supply of a second fluid which is in communication with a spherical object moving between the inlet and the outlet.

13 Claims, 2 Drawing Sheets

US 6,663,325 B1

TRANSPORT SYSTEM FOR SPHERICAL OBJECTS AND METHOD OF USING THE TRANSPORT SYSTEM

BACKGROUND OF THE INVENTION

1. Field of the Invention

This invention relates to the transport of objects, such as spherical objects, and, more particularly, to a system which communicates objects between a housing inlet and outlet without contact with the housing, and which changes the environment for the object during the transport process, as by changing a fluid within which the objects are entrained.

2. Background Art

It is known to make a semiconductor device by forming a circuit pattern on a silicon wafer and to form semiconductor chips by strategically cutting the wafer. Recent developments have permitted the formation of circuit patterns on a spherical semiconductor, such as a single crystal silicon sphere, having a diameter of 1 mm or less, to thereby form semiconductor elements. For example, to form discrete elements or semiconductor integrated circuits, such as solar cells or light sensors using single crystal silicon spheres, processing steps such as mirror polishing, cleaning, film forming, resist coating, photolithography, and etching, may be performed. To efficiently carry out the overall process, an assembly line may be used in which the processing steps are serially performed. The surface of a single crystal silicon sphere is susceptible to being damaged by contact with a conveying apparatus. Thus, contactless transport is desired.

The processing steps may be performed in different environments, which may contain fluids such as water, different solutions, or active or inert gases. If the processing steps are performed serially at different processing stations, the environment used to transport the object generally must not be delivered to the next processing station. Accordingly, an operation is needed between the processing steps to remove the environment from the previous step and change the environment to one suitable for the next processing step, while transporting the object to be processed to the station for carrying the next processing step out. Reliable, high speed processing is sought in such systems.

If the silicon spheres are transported in irregular intervals from one processing step to the next, or the number of silicon spheres supplied is changed in this type of system, the processing conditions at the various stations must be changed to conform to this transport pattern. Thus, the desired efficiency may be difficult to achieve. Ideally, spherical objects, such as silicon spheres, are processed so that there is a regular interval between steps, thereby allowing the spheres at each station to be supplied in prescribed and regular intervals to the next processing station for performance of the next processing step.

The surface of silicon spheres is easily oxidized, with a film easily formed on the surface thereof. Contact with the conveying system or atmosphere may alter the properties of the top layer. Ideally, transport and processing of the silicon spheres is carried out without contact with the transporting structure and without communication with the surrounding atmosphere.

SUMMARY OF THE INVENTION

In one form, the invention is directed to a transport system for a spherical object. The transport system has a supply of a first fluid and a passageway for communication of a spherical object in a path between an inlet and an outlet. At least part of the passageway is bounded by a first tube having a first annular wall with at least one opening through the first annular wall. The first tube guides flow of a spherical object in the first fluid from the inlet towards the outlet. The transport system further includes a source of vacuum in communication with the passageway through the at least one opening through the first annular wall. The source of vacuum produces a low pressure region which causes the first fluid in the passageway to be drawn from the passageway through the at least one opening through the first annular wall. The transport system further includes a supply of a second fluid which is in communication with a spherical object moving between the inlet and the outlet.

The transport system may include a second tube surrounding the first tube so that a chamber is defined between the first tube and the second tube. The second tube has a second annular wall with an opening therethrough. The source of vacuum produces a low pressure region outside of the second tube which causes the first fluid in the passageway to be drawn from the at least one opening into the chamber and from the chamber to and through the opening in the second annular wall to outside of the second tube.

The transport system may include a spherical object to be communicated between the inlet and outlet.

The transport system may include a structure for accelerating the discharge of a spherical object in the passageway from the outlet.

The transport system may include a port through which the second fluid can be introduced at a first location between the inlet and outlet to the passageway in a direction transverse to the path of a spherical object to create a spiral vortex flow of the second fluid around an axis extending generally parallel to at least a part of the path.

The passageway may be defined by a tapered surface having a diameter that increases from the first location towards the outlet.

A second opening may be provided through which the second fluid in the spiral vortex flow and the first fluid picked up by the spiral vortex flow are discharged from the passageway.

In one form, the spiral vortex flow causes the second fluid to flow upstream in the first tube to the at least one opening through the first annular wall so as to be drawn with the first fluid through the at least one opening through the first annular wall.

In one form, the inner tube is made from a porous material that defines the at least one opening through the first annular wall, the inner tube has a surface bounding the passageway and having a first diameter, the spherical object has a second diameter, and the first diameter is slightly larger than the second diameter.

The inner tube may be made from a mesh material.

In one form, each of the first and second fluids is a gas and the spherical object is a single crystal silicon sphere.

A temperature control may be provided for changing the temperature of the second fluid.

In one form, the spherical object and the at least one opening through the first annular wall are relatively sized so that the spherical object cannot pass through the at least one opening through the first annular wall.

The transport system may further include an isolation element which shields a spherical element moving in the path from turbulence generated by the spiral vortex flow.

The invention is further directed to a transport system for a spherical object, which transport system includes a supply of a first fluid and a passageway for communication of a spherical object in a path between an inlet and an outlet. The passageway is defined at least in part by a Laval nozzle having a) a first tapered section with a surface bounding the passageway and having a diameter that decreases in a direction from the inlet towards the outlet, b) a second tapered section with a surface bounding the passageway and having a diameter that increases in a direction from the inlet towards the outlet, and c) a center section between the first and second tapered sections. The transport system further includes a supply of a second fluid and at least one port through which the second fluid can be introduced to the passageway in a direction transverse to the path of a spherical object at a first location between the inlet and outlet so that the second fluid diverges from the first location into both the first and second tapered sections. The outlet is downstream of the second tapered section.

The at least one port is oriented so that the second fluid introduced through the at least one port creates a spiral vortex flow.

The transport system may further include at least one opening communicating from the passageway to externally of the passageway between the inlet and the outlet and a source of vacuum which produces a low pressure region which causes the first fluid and the second fluid in the spiral vortex flow to be drawn from the passageway through the at least one opening.

In one form, the transport system includes at least a second opening communicating from the passageway to externally of the passageway between the inlet and the outlet. The second fluid in the spiral vortex flow communicates through the at least second opening from the passageway to externally of the passageway.

The at least part of the passageway may be bounded by a tube, with the tube being made of a porous material defining the at least one opening.

The transport system may further include a spherical object to be communicated between the inlet and the outlet, with the spherical object and at least one opening being relatively dimensioned so that the spherical object cannot pass through the at least one opening.

In one form, at least part of the passageway is bounded by a tube that is made from a mesh material.

In one form, the spherical object is a single crystal silicon sphere and each of the first and second fluids is a gas.

A temperature control may be provided for changing the temperature of the second fluid.

The transport system may further include an isolation element which shields a spherical object moving in the path from turbulence generated by the spiral vortex flow.

The invention is further directed to a transport system for a spherical object, which transport system includes a supply of a first fluid, and a passageway for communication of a spherical object in a path between an inlet and an outlet. At least part of the passageway is bounded by a first tube having a first annular wall with at least one opening through the first annular wall. The first tube guides flow of a spherical object in the first fluid from the inlet towards the outlet. The transport system further includes a source of vacuum in communication with the passageway through the at least one opening through the first annular wall. The source of vacuum produces a low pressure region which causes the first fluid in the passageway to be drawn from the passageway through the at least one opening through the first annular wall. The transport system further includes a supply of a second fluid which is in communication with a spherical object moving between the inlet and the outlet. The passageway is defined at least in part by a Laval nozzle having a) a first tapered section with a surface bounding the passageway and having a diameter that decreases in a direction from the inlet towards the outlet, b) a second tapered section with a surface bounding the passageway and having a diameter that increases in a direction from the inlet towards the outlet, and c) a center section between the first and second tapered sections. The transport system further has at least one port through which the second fluid can be introduced to the passageway in a direction transverse to the path of a spherical object at a first location between the inlet and the outlet so that the second fluid diverges from the first location into both the first and second tapered section.

The at least one port may include at least first and second ports arranged at diametrically opposite locations relative to the passageway.

The at least one port may be oriented so that the second fluid introduced through the at least one port creates a spiral vortex flow.

The second fluid in the spiral vortex flow may be drawn with the first fluid through the at least one opening. The transport system may further include at least a second opening communicating from the passageway to externally of the passageway between the inlet and the outlet. The second fluid in the spiral vortex flow communicates through the at least second opening from the passageway to externally of the passageway.

The first tube may be made from a porous material that defines the at least one opening.

The first tube may be made from a mesh material defining the at least one opening.

The transport system may further include a spherical object that is a single crystal silicon sphere, and each of the first and second fluids may be a gas.

Temperature control structure may be provided for changing the temperature of the second fluid.

An isolation element may be provided to shield a spherical object moving in the path from turbulence generated by the spiral vortex flow.

The invention is also directed to a transport system for an object, which transport system consists of a supply of a first fluid and a housing defining a passageway for communicating an object in a path between an inlet and an outlet. At least a first opening through the housing communicates from the passageway to externally of the: passageway. A source of vacuum produces a first low pressure region which causes the first fluid in the passageway to be drawn from the passageway through the at least one opening. A supply of a second fluid is in communication with an object moving in the passageway between the inlet and the outlet.

The transport system may include a nozzle, and at least one port through which the second fluid is introduced to the passageway to create a spiral vortex flow in the passageway.

The second fluid in the spiral vortex flow may mix with the first fluid- and move from the passageway through the at least one opening.

The object may be a single crystal silicon sphere, with each of the first and second fluids being a gas.

The invention is also directed to a method of transporting an object within a passageway between an inlet and an outlet. The method includes the steps of directing a first fluid with an object into the passageway through the inlet, creating a low pressure region between the inlet and the outlet, drawing the first fluid out of the passageway into the low pressure region, directing a second fluid into the passageway in a direction toward the inlet so that the second fluid mixes with the first fluid and is drawn out of the passageway into the low pressure region outside of the passageway, and directing the object through the second fluid to the outlet.

The step of directing a second fluid into the passageway may involve directing the second fluid into the passageway so that the second fluid creates a spiral vortex flow.

The object may be directed to the outlet only under the force of gravity.

The object may be a spherical object, such as a single crystal silicon sphere.

The method may further include the step of directing at least a part of the spiral vortex flow from the passageway at a location between the inlet and outlet and spaced from the low pressure region.

DETAILED DESCRIPTION OF THE DRAWINGS

Figure 1:
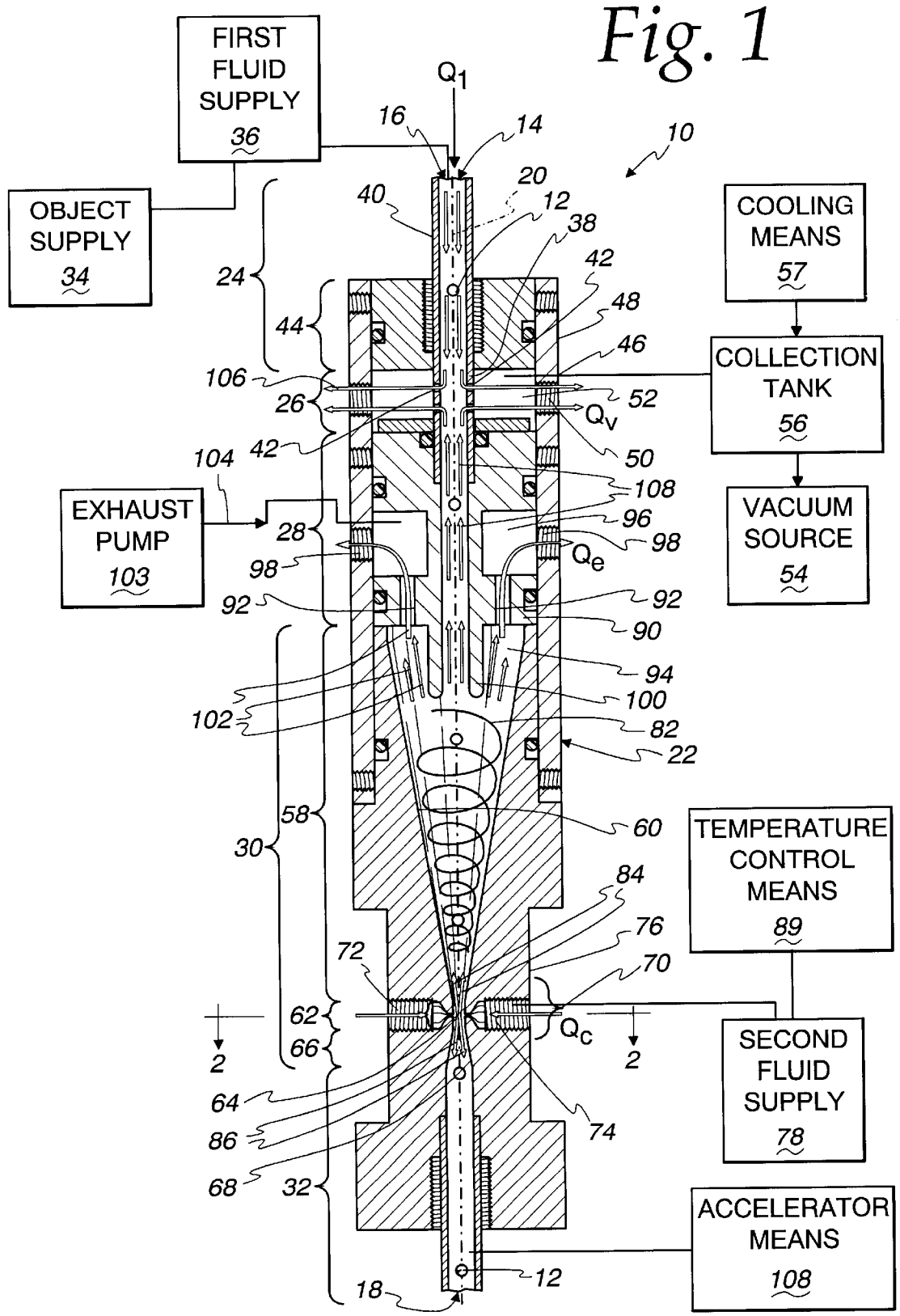
FIG. 1 is cross-sectional view of a transport system, according to the present invention.
Figure 2:
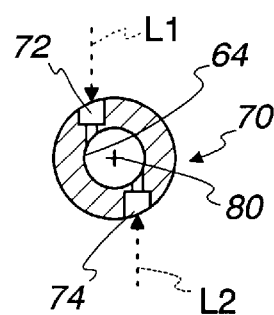
FIG. 2 is a cross-sectional view of a housing on the transport system, taken along line 2—2 of FIG. 1.

In FIGS. 1 and 2, a transport system, according to the present invention, is shown at 10 for communicating spherical objects 12 through a passageway 14 having an inlet 16 and an outlet 18. The passageway defines substantially a straight line path, as indicated by the dotted line/central axis 20, for the spherical objects 12 between the inlet 16 and outlet 18.

The transport system 10 includes a multi-stage housing 22 consisting of a supply stage 24, a suction stage 26, a pressure adjusting stage 28, a nozzle stage 30, and an ejection stage 32.

In this embodiment, the transport system 10 may be used to effect environment replacement for spherical objects 12 that are single crystal silicon spheres, having a size of approximately 1 mm diameter. However, use of the inventive transport system 10 is not limited to this function. Through the transport system 10, the single crystal silicon spheres 12, treated with air in an oxide film growing process using thermal oxidation, can be communicated in a contactless manner between the inlet 16 and outlet 18.

More particularly, the silicon spheres 12 are delivered from a supply 34 with air from a fluid supply 36 to the inlet 16 at the passageway 14. The silicon spheres 12, by reason of the thermal oxidation process, have an oxide film formed on the surface thereof.

The passageway 14 through the supply stage 24 is defined by an inner tube 38 having an annular wall 40. The annular wall 40 has openings 42 extending radially therethrough. The number and diameter of the openings 42 can vary considerably, so long as variation in the number and diameter of the openings 42 does not prevent smooth movement of the silicon spheres 12 through the passageway 14. The inner tube 38 may be made from Teflon® material or may be made from a porous material formed by sintering ceramic, resin, or metal powder. If resin is used to make the inner tube 38, it is preferred that fluoride resin be used from the standpoint of heat resistance, chemical resistance, and the ability to be formed by a sintering process.

The supply stage 24 includes a coupling section 44, through which silicon spheres 12 are communicated to the suction stage 26.

The suction stage 26 includes an outer tube 46 with an annular wall 48 having openings 50 extending radially therethrough. A chamber 52 is defined between the inner tube 38 and outer tube 46. The chamber 52 is connected to an external vacuum source 54 and a collection tank 56, which may be cooled by a cooling means 57.

In the exemplary embodiment, the inner diameter of the inner tube 38 is approximately 4 mm, with the outer diameter being approximately 6 mm. The vacuum source 54 is used to establish a negative pressure state in the chamber 52.

The nozzle stage 30 shown includes a Laval nozzle formed downstream of the pressure adjusting stage 28. The Laval nozzle consists of a first tapered section 58 with a frustoconical surface 60 having a progressively decreasing diameter from the inlet side towards the outlet side thereof. The Laval nozzle has a center section 62 bounded by a uniform diameter surface 64 with the smallest nozzle diameter. The Laval nozzle consists of a second tapered section 66, downstream of the center section 62, bounded by a surface 68 which gradually increases in diameter from the center section 62 towards the outlet 18.

A counterflow system 70 at the center section 62 consists of diametrically opposite supply ports 72, 74, each of which has a stepped diameter and communicates fully through the nozzle wall 76 bounding the passageway 14. Through the supply ports 72, 74, a second fluid from a separate supply 78 is simultaneously delivered under pressure into the passageway 14 at the center section 62 along lines L1, L2, which are spaced equally from the central axis 80 of the center section 62. High pressure, tangential flow delivered in this manner produces a spiral vortex flow, as indicated by the line 82, in the passageway 14 in the first tapered section 58 of the Laval nozzle. The spiral vortex flow causes fluid from the supply 78 to diverge and move both in a downstream direction, as indicated by the arrows 84, and in an upstream direction, as indicated by the arrows 86. The fluid in the supply 78 is preferably an inert gas, such as nitrogen, that may be heated or cooled by a temperature control means 89. The silicon spheres 12 moving in the fluid/inert gas can thus be heated or cooled.

The pressure adjusting stage 28 consists of an isolation element 90 with openings 92 extending therethrough between a chamber 94 in the first tapered section 58 and an annular chamber 96 upstream of the chamber 94. Radially extending openings 98 in the annular wall 48 communicate from the annular chamber 96 to externally of the housing 22. The isolation element 90 includes an annular neck 100 which projects into the chamber 94.

Fluid flow from the chamber 94, in the direction of the arrows 102 through the openings 92, the annular chamber 96, and the openings 98, may occur naturally. Alternatively, an exhaust pump 103 may supply fluid, such as the type in the supply 78, in a reverse direction, as indicated by the arrows 104, to reduce the outflow of fluid in a path indicated by the arrows 102.

Operation using the transport system 10 will now be described with exemplary single crystal silicon spheres 12.

The silicon spheres 12 may be supplied for subsequent processing following thermal oxidation, as typically occurs at temperatures in the range of 300° C. in air.

The chamber 52 is set in a negative pressure state relative to the pressure in the passageway 14 by the vacuum source 54. The vacuum source 54 is controllable to select the pressure state, as desired. Silicon spheres 12 entrained in the first fluid from the supply 36, which is air/oxygen, are drawn in and through the inlet 14. The first fluid is diverted from the passageway 14 radially outwardly in the direction of the arrows 106 through the inner tube openings 42, into the chamber 52, and from the chamber 52 through the openings 52 into the collection tank 56. Air in the negative pressure state continues to move downstream through the passageway 14 to the Laval nozzle.

The second fluid, nitrogen gas, is directed under pressure from the supply 78 into the supply ports 72, 74, thereby producing the spiral vortex flow 82 into which the silicon spheres 12 are drawn. By introducing the flow at the small diameter center section 62, high fluid flow speed can be established. The nitrogen flow diverges from the center section 62 both upstream into the first tapered section 58 and downstream into the second tapered section 66. Air upstream of the Laval nozzle is placed in a negative pressure state in the suction stage 26, which causes upstream flow of nitrogen gas from the supply 78, as indicated by the arrows 108, so that the nitrogen gas is mixed with the air flowing from upstream and discharges from the passageway 14 through the chamber 52 and openings 50. Through this process, the backflow of nitrogen and outflow of air cause a progressive reduction of air as the environment for the spheres 12 as they convey from the inlet 16 toward the outlet 18.

The backflowing nitrogen gas also diverts in the direction of the arrows 102 around the neck 100 to pass through the openings 92 of the annular chamber 96, and the openings 98, to externally of the housing 22. The neck 100 shields the conveying silicon spheres 12 from turbulence generated by the spiral vortex flow. The backflow through the pressure adjusting stage 28 can take place naturally, or may be altered by controlled operation of the exhaust pump 103.

The silicon spheres 12 flowing outwardly from the neck 100 are guided centrally along the surface 60 which progressively decreases in diameter, through the mixed fluid in the spiral vortex flow, which mixed fluid discharges to externally of the housing 22 through the pressure adjusting stage 28.

Nitrogen supplied through the counterflow system 70 diverts to a downstream direction through the second tapered section 66. The entrained silicon spheres 12 thus flow efficiently from the center section 62 to and through the second tapered section 66 for discharge at the outlet 18 on the ejection stage 32. The discharging spheres 12 reside primarily in the environment of the second fluid and are caused to be substantially centered in the passageway 14 as they are conveyed so that they do not contact the housing 22. Since the passageway 14 is relatively small in volume, a relatively small volume of the first fluid is required to be replaced by the second fluid to change the environment for the discharging spheres 12. The next process can be carried out without concern about the nature of the first fluid.

The silicon spheres 12 may be discharged under only forces produced by gravity, which contributes to overall simplicity. The backflow of the second fluid is controlled so that upward forces produced thereby on the silicon spheres 12 do not exceed the gravitational forces on the silicon spheres 12. In the above embodiments, the fluids were described as gases. However, liquids might also be used for the first and second fluids. In addition to an inert gas, the second fluid may be hydrogen, a reducing gas such as halogen, or a reactive gas.

Table 1, below, shows the relationship between the inflow rate Qi for the silicon spheres 12 entrained in the air and the vacuum flow rate $Q_v$ from the chamber 52 in the suction stage 26 for an outflow rate $Q_O$ of zero at the outlet 18 in a constant counterflow flow rate $Q_c$ at the supply ports 72, 74, and the resulting transport state for the silicon spheres 12.

TABLE 1

| $Q_o$ (Nl/min) | 0.0 | | | | | | | | | |
|---|---|---|---|---|---|---|---|---|---|---|
| $Q_c$ (Nl/min) | 0.3 | | | | | | | | | |
| $Q_i$ (Nl/min) | 0.0 | 0.0 | 0.0 | 0.5 | 0.5 | 0.5 | 1.0 | 1.0 | 1.0 | 1.0 |
| $Q_v$ (Nl/min) | 1.0 | 2.0 | 3.0 | 1.0 | 2.0 | 3.0 | 1.0 | 2.0 | 3.0 | 4.0 |
| Sphere Behavior | ○ | Δ | X | ○ | ○ | Δ | ○ | ○ | Δ | X |

○: Excellent sphere transport.
Δ: Somewhat poor sphere transport. Sometimes there is rotation and clogging in the Laval nozzle.
X: Poor sphere transport. The spheres are not transported because of the rotation and clogging in the Laval nozzle.
$Q_v$ (Nl/min) vacuum flow rate
$Q_c$ (Nl/min) counterflow flow rate
$Q_i$ (Nl/min) inflow rate
$Q_o$ (Nl/min) outflow rate From this table, it can be seen that the free fall communication of the silicon spheres 12 can be satisfactorily carried out by appropriately selecting the vacuum flow rate $Q_v$ to match the inflow rate $Q_i$, with the outflow rate $Q_O$ at zero. Since the vacuum flow rate $Q_v$ tends to divert the silicon spheres 12 out of a centered position on the path 20, it is desirable that the vacuum flow rate $Q_v$ not exceed twice the inflow rate $Q_i$.

Table 2, below, shows measurements of oxygen concentration at the outlet 18, using a gas detection tube, with nitrogen used as the fluid in the supply 78.

TABLE 2

| $Q_O$ (Nl/min) | 0.0 | | | |
|---|---|---|---|---|
| $Q_c$ (Nl/min) | 0.3 | | | |
| $Q_i$ (Nl/min) | 1.0 | | | |
| $Q_v$ (Nl/min) | 0.0 | 0.5 | 1.0 | 2.0 |
| Oxygen concentration at outlet | 1% | 1% | 0% | 0.0% |

With the counterflow flow rate $Q_c$ at 0.3 Nl/min, and the vacuum flow rate $Q_v$ at least 1.0 Nl/min, the oxygen concentration at the outlet 18 was 0%. The 0% oxygen concentration uses a gas detection tube for detecting 3% oxygen and indicates a change for a reaction with gas at 5 times a normal, fixed quantity. The 0.0% oxygen concentration uses the gas detection tube for detecting 3% oxygen and indicates absolutely no change for a reaction with gas at 5 times a normal, fixed quantity.

Figure 3:
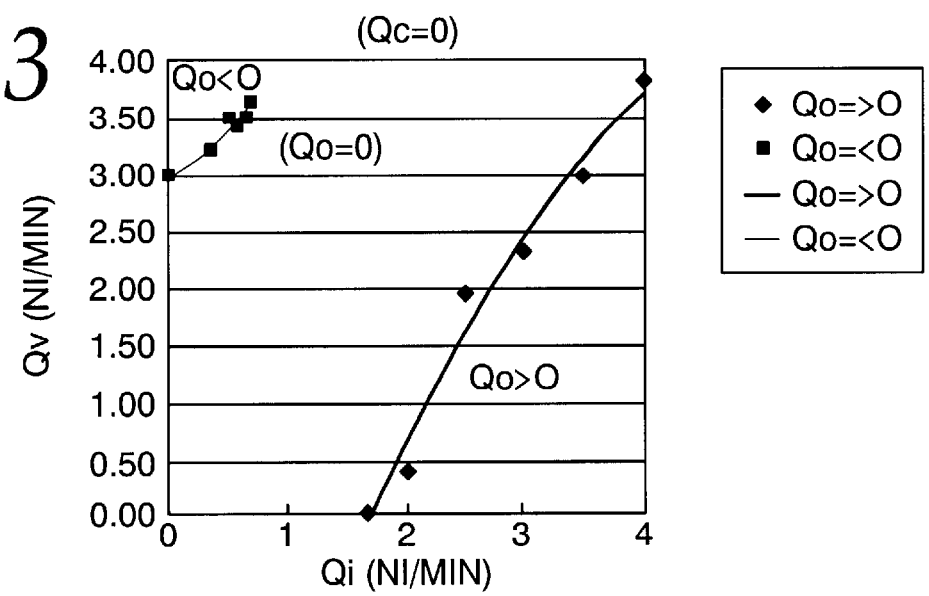
FIG. 3 is a graph showing the relationship of the outflow rate with respect to the inflow rate and the vacuum flow rate for a counterflow rate of zero, using the inventive transport system.
Figure 4:
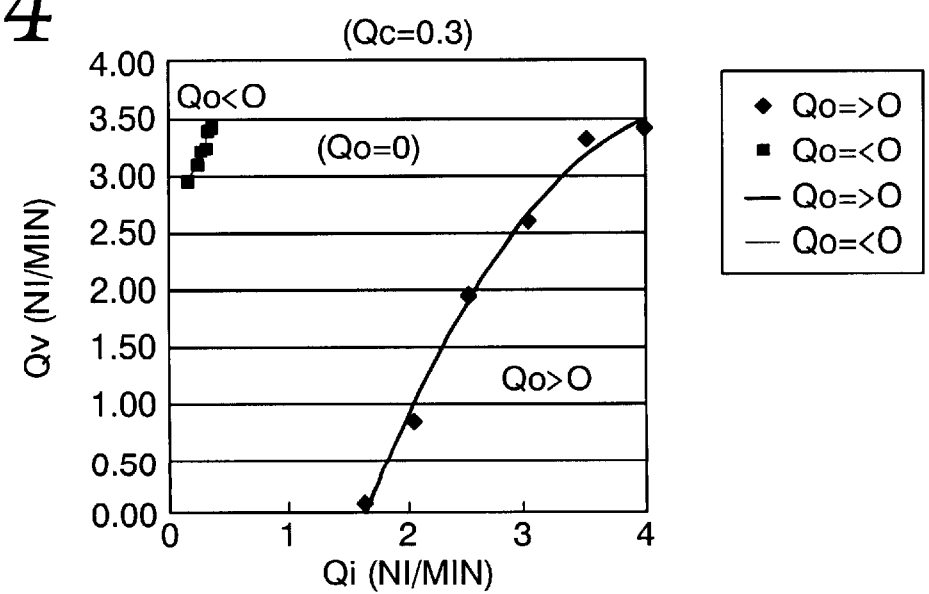
FIG. 4 is a graph showing the relationship of the outflow rate with respect to the inflow rate and vacuum flow rate for a counterflow rate of 0.3 Nl/min, using the inventive transport system.

FIGS. 3 and 4 show the regions where the vacuum flow rate $Q_v$ and the inflow rate $Q_i$ are changed and the outflow rate $Q_O$ become zero for a counterflow rate $Q_c$ of 0 Nl/min and 0.3 Nl/min, respectively. The vacuum flow rate $Q_v$, the inflow flow rate $Q_i$, and the counterflow flow rate $Q_c$ can be changed to obtain the gas flow rate desired at the outlet 18.

At the outlet 18, only the silicon spheres 12 are ejected by free fall and may be discharged with the second gas. The ejection of the silicon spheres 12 may be accelerated by an accelerator means 108. The accelerator means 108 may produce pulses of the inert fluid/nitrogen to produce the ejection of the individual silicon spheres at predetermined intervals.

The spiral vortex is efficiently formed in the Laval nozzle around the path/axis 20 so as to prevent the silicon spheres 12 from contacting the walls surrounding the passageway 14. However, the invention is not limited to the use of a Laval nozzle. The teachings herein could be practiced using a nozzle having another shape, such as a straight tubular shape.

In certain situations, it may be desirable to completely replace the environment so that substantially none of the first fluid from the supply 36 remains. To accomplish this, a plurality of transport systems 10, as that described above, can be connected serially, as in the embodiment described below. This arrangement may improve efficiency of the environment replacement.

In the embodiment described above, at least a portion of the flow of the first fluid from the supply 36 moving downstream of the chamber 52 is mixed in, accelerated by, and efficiently removed by the spiral vortex flow formed with the second fluid from the supply 78 accelerated in an upstream direction by the counterflow system 70. The first fluid that flows downstream from the counterflow system 70 efficiently discharges and as a result the environment is conveyed to the next stage for processing. Accordingly, a complex structure and control mechanism are not needed to change the environment for the silicon spheres 12.

If the fluids used in two consecutive processes are highly reactive, the apparatus of the present invention can be carried out in two stages. In the first stage, a first fluid, such as an inert gas, can be used. In the second stage, the fluid/gas for the next process can be used.

If an inert gas at a predetermined, controlled temperature is supplied to the counterflow system 70, the processed object, such as the silicon sphere 12, can be guided at high speed at that predetermined temperature. Annealing at a high temperature is facilitated.

Using the inventive transport system 10, fabricating MOS devices using silicon spheres 12 and fabricating solar cells can be carried out without exposure to the atmosphere by combining a transport passageway using a closed space, a rotating take-up device, and fluid/gas.

For example, MOSFETs can be fabricated in a closed space without exposure to the atmosphere by polishing silicon spheres 12 inside a polishing apparatus and then by using the inventive transport system 10 to transport them between stages and to supply and discharge the controlled fluids/gases.

First, a gate electrode may be formed by cleaning a single crystal silicon sphere 12, removing the natural oxidation film on the surface, forming a gate insulating film by thermal oxidation, forming the polycrystalline silicon layer by a CVD process, and then patterning the polycrystalline silicon layer by a photolithographic process.

After forming the interlayer insulating film, a polycrystalline silicon film containing the desired impurities is formed on the surface. By diffusing the polycrystalline silicon film, source and drain regions can be formed. The polycrystalline silicon layer becomes the source and drain contact layer.

By forming the electrodes, the MOSFET can be efficiently formed inside the closed space.

The inventive transport system 10 allows desired surface processing to be formed with a relatively small amount of fluid/gas. A spiral vortex can be used to efficiently discharge the fluid/gas from a previous process and replace the fluid/gas with one usable in the next process. Accordingly, semiconductor devices can be formed that are highly reliable and with excellent yield because peeling and scratching do not occur.

The present invention makes possible the contactless transport of spherical objects without damage thereto and without the use of complex mechanisms.

The invention also makes it possible to transport spherical objects to change the object environment without exposure to the atmosphere between consecutive processing steps, while transporting the objects at relatively high speeds.

In one application, it is possible to facilitate high speed, reliable, semiconductor processing, such as film growing and etching processes, for a spherical semiconductor such as a single crystal silicon sphere. A spherical object in a first fluid can be controlled within the transport system so that the spherical object departs the transport system in a second fluid.

The foregoing disclosure of specific embodiments is intended to be illustrative of the broad concepts comprehended by the invention.

What is claimed is:

1. A transport system for a spherical object, said transport system comprising:

a supply of a first fluid;

a passageway for communication of a spherical object in a path between an inlet and an outlet, at least a part of the passageway bounded by a first tube having a first annular wall with at least one opening through the first annular wall, the first tube configured to guide flow of a spherical object in the first fluid from the inlet towards the outlet;

a source of vacuum in communication with the passageway through the at least one opening through the first annular wall, the source of vacuum producing a low pressure region which causes the first fluid in the passageway to be drawn from the passageway through the at least one opening through the first annular wall;

a supply of a second fluid which is in communication with a spherical object moving between the inlet and the outlet; and a spherical object to be communicated between the inlet and outlet, wherein each of the first and second fluids is a gas and the spherical object is a single crystal silicon sphere.

2. A transport system for a spherical object, said transport system comprising:

a supply of a first fluid;

a passageway for communication of a spherical object in a path between an inlet and an outlet, at least a part of the passageway bounded by a first tube having a first annular wall with at least one opening through the first annular wall, the first tube guiding flow of a spherical object in the first fluid from the inlet towards the outlet;

a source of vacuum in communication with the passageway through the at least one opening through the first annular wall, the source of vacuum producing a low pressure region which causes the first fluid in the passageway to be drawn from the passageway through the at least one opening through the first annular wall; and a supply of a second fluid which is in communication with a spherical object moving between the inlet and the outlet, said transport system further comprising a second tube surrounding the first tube so that a chamber is defined between the first tube and the second tube, the second tube having a second annular wall with an opening therethrough, and the source of vacuum produces the low pressure region outside of the second tube which causes the first fluid in the passageway to be drawn from the at least one opening into the chamber and from the chamber to and through the opening in the second annular wall to outside of the second tube, said transport system further comprising a spherical object to be communicated between the inlet and outlet.

3. The transport system according to claim 2 wherein the first tube comprises a porous material that defines the at least one opening through the first annular wall, the inner tube has a surface bounding the passageway having a first diameter, the spherical object has a second diameter, and the first diameter is slightly larger than the second diameter.

4. The transport system according to claim 2 wherein the spherical object and at least one opening through the first annular wall are relatively sized so that the spherical object cannot pass through the at least one opening through the first annular wall.

5. A method of transporting a silicon sphere within a passageway between an inlet and an outlet, said method comprising the steps of:

directing a first fluid with the silicon sphere into the passageway through the inlet and toward the outlet;

creating a low pressure region at a location between the inlet and outlet;

drawing the first fluid out of the passageway into the low pressure region;

directing a second fluid into the passageway in a direction toward the inlet so that the second fluid mixes with the first fluid and is drawn out of the passageway; and directing the object through the second fluid to the outlet.

6. The method of transporting a silicon sphere according to claim 5 wherein the step of directing a second fluid into the passageway comprises directing the second fluid into the passageway so that the second fluid creates a spiral vortex flow.

7. The method of transporting a silicon sphere according to claim 5 wherein the silicon sphere is directed to the outlet only under the force of gravity.

8. The method of transporting a spherical object according to claim 5 wherein the spherical object is a single crystal silicon sphere.

9. A transport system for an object, said transport system comprising:

a supply of a first fluid;

a housing defining a passageway for communication of an silicon sphere in a path between an inlet and an outlet, at least one first opening through the housing communicating from the passageway to externally of the passageway, a source of vacuum producing a first low pressure region which causes the first fluid in the passageway to be drawn from the passageway through the at least one opening; and a supply of a second fluid which is in communication with an silicon sphere moving in the passageway between the, inlet and the outlet, said transport system further comprising a nozzle, and at least one port through which the second fluid is introduced to the passageway to create a spiral vortex flow in the passageway, wherein the second fluid in the spiral vortex flow mixes with the first fluid and moves from the passageway through the at least one opening, said transport system further including an object comprising a single crystal silicon sphere,:

wherein each of the first and second fluids is a gas.

10. A transport system for a spherical object, said transport system comprising:

a supply of a first fluid;

a passageway for communication of a spherical object in a path between an inlet and an outlet, the passageway defined at least in part by a Laval nozzle comprising a) a first tapered section with a surface bounding the passageway and having a diameter that decreases in a direction from the inlet towards the outlet, b) a second tapered section with a surface bounding the passageway and having a diameter that increases in a direction from the inlet towards the outlet, and c) a center section between the first and second tapered sections;

a supply of a second fluid; and at least one port through which the second fluid can be introduced to the passageway in a direction transverse to the path of a spherical object at a first location between the inlet and outlet so that the second fluid diverges from the first location into both the first and second tapered sections, the outlet being downstream of the second tapered section, wherein the at least one port is oriented so that the second fluid introduced through the at least one port creates a spiral vortex flow, said transport system further comprising at least one opening communicating from the passageway to externally of the passageway between the inlet and the outlet, and a source of vacuum which produces a low pressure region which causes the first fluid and the second fluid in the spiral vortex flow to be drawn from the passageway through the at least one opening, wherein at least part of the passageway is bounded by a tube and the tube comprises a porous material defining the at least one opening.

11. A transport system for a spherical object, said transport system comprising:

a supply of first fluid;

a passageway for communication of a spherical object in a path between an inlet and an outlet, at least a part of the passageway bounded by a first tube having a first annular wall with at least one opening through the first annular wall, the first tube configured to guide flow of a spherical object in the first fluid from the inlet towards the outlet;

a source of vacuum in communication wit the passageway through the at least one opening through the first annular wall, the source of vacuum producing a low pressure region which causes the first fluid in the passageway to be drawn from the passageway through the at least one opening through the first annular wall;

a supply of a second fluid which is in communication with a spherical object moving between the inlet and the outlet, the passageway defined at least in part by a Laval nozzle comprising a) a first tapered section with a surface bounding the passageway and having a diameter that decreases in a direction from the inlet towards the outlet, b) a second tapered section with a surface bounding the passageway and having a diameter that increases in a direction from the inlet towards the outlet, and c) a center section between the first and second tapered sections; and at least one port through which the second fluid can be introduced to the passageway in a direction transverse to the path of a spherical object at a first location between the inlet and outlet so that the second fluid diverges from the first location both into the first and second tapered sections, the outlet being downstream of the second tapered section, wherein the first tube comprises a porous material that defines the at least one opening.

12. A transport system for a spherical object, said transport system comprising:

a supply of a first fluid;

a passageway for communication of a spherical object in a path between an inlet and an outlet, at least a part of the passageway bounded by a first tube having a first annular wall with at least one opening through the first annular wall, the first tube configured to guide flow of a spherical object in the first fluid from the inlet towards the outlet;

a source of vacuum in communication wit the passageway through the at least one opening through the first annular wall, the source of vacuum producing a low pressure region which causes the first fluid in the passageway to be drawn from the passageway through the at least one opening through the first annular wall;

a supply of a second fluid which is in communication with a spherical object moving between the inlet and the outlet, the passageway defined at least in part by a Laval nozzle comprising a) a first tapered section with a surface bounding the passageway and having a diameter that decreases in a direction from the inlet towards the outlet, b) a second tapered section with a surface bounding the passageway and having a diameter that increases in a direction from the inlet towards the outlet, and c) a center section between the first and second tapered sections; and at least one port through which the second fluid can be introduced to the passageway in a direction transverse to the path of a spherical object at a first location between the inlet and outlet so that the second fluid diverges from the first location both into the first and second tapered sections the outlet being downstream of the second tapered section, wherein the transport system further comprises a spherical object comprising a single crystal silicon sphere, wherein each of the first and second fluids is a gas.

13. A transport system according to claim 12 further comprising a temperature control means for changing the temperature of the second fluid.

* * * * *

UNITED STATES PATENT AND TRADEMARK OFFICE
CERTIFICATE OF CORRECTION

PATENT NO. : 6,663,325 B1
DATED : December 16, 2003
INVENTOR(S) : Shuho Kai et al.

It is certified that error appears in the above-identified patent and that said Letters Patent is hereby corrected as shown below:

Title page,
Item [30], Foreign Application Priority Data, "H 11-154328" should read
-- H 11-154382 --.

Signed and Sealed this

Fourth Day of May, 2004

JON W. DUDAS
*Acting Director of the United States Patent and Trademark Office*